United States Patent
Bhavsar et al.

[19]

[11] Patent Number: 6,163,864
[45] Date of Patent: Dec. 19, 2000

[54] METHOD FOR COST-EFFECTIVE PRODUCTION TESTING OF INPUT VOLTAGE LEVELS OF THE FORWARDED CLOCK INTERFACE OF HIGH PERFORMANCE INTEGRATED CIRCUITS

[75] Inventors: Dilip K. Bhavsar, Shrewsbury; Larry L. Biro, Oakham, both of Mass.

[73] Assignee: Compaq Computer Corporation, Houston, Tex.

[21] Appl. No.: 09/095,149

[22] Filed: Jun. 10, 1998

[51] Int. Cl.[7] .................................................. G01R 31/28
[52] U.S. Cl. .................... 714/727; 714/728; 714/726; 714/30; 375/106; 327/145
[58] Field of Search ..................................... 714/727, 728

[56] References Cited

U.S. PATENT DOCUMENTS

| | | | |
|---|---|---|---|
| 4,979,190 | 12/1990 | Sager et al. | 375/106 |
| 5,221,865 | 6/1993 | Phillips et al. | 307/465 |
| 5,498,972 | 3/1996 | Haulin | 324/765 |
| 5,627,842 | 5/1997 | Brown et al. | 714/727 |
| 5,633,599 | 5/1997 | Kubota | 326/16 |
| 5,673,276 | 9/1997 | Jarwala et al. | 714/727 |
| 5,673,277 | 9/1997 | Amitai et al. | 714/727 |
| 5,872,908 | 2/1999 | Whetsel | 714/726 |
| 5,887,001 | 3/1999 | Russell | 714/727 |
| 5,900,753 | 5/1999 | Cote et al. | 327/145 |
| 5,983,379 | 11/1999 | Warren | 714/727 |
| 6,000,051 | 12/1999 | Nasdeau-Dostie et al. | 714/727 |

OTHER PUBLICATIONS

Almy, Making Precise At–Speed Timing Measuremnets via Boundary–Scan, IEEE, 1997.
Crouch, et al., Low Power Mode and IEEE 1149.1 Compliance: A Low Power Solution, IEEE, 1994.
Gage, Scan Control Transport Levels, IEEE, 1994.
Mukherjee, et al., Control Strategies for Chip–Based DFT/BIST Hardware, IEEE, 1994.
Whetsel, Improved Bounday Scan Design, IEEE, 1995.
Kadaras, A Chip to Embedded System Test Process Using IEEE 1149.1 Boundary Scan, IEEE, 1994.
Harrod, et al., Boundary Scan Design for a Memory controller, IEEE, 1990.

*Primary Examiner*—Albert De Cady
*Assistant Examiner*—Guy Lamarre
*Attorney, Agent, or Firm*—Cesari and McKenna, LLP

[57] ABSTRACT

A boundary scan based VIH/VIL test scheme for a clock forwarded interface of an IEEE 1149.1 Standard-compliant electronic component is provided. The Standard-compliant component has a test access port (TAP) and a forwarded clock interface including data and forwarded clock inputs for receiving signals from and sending signals to external circuitry during a test operation. Connected to each of such component's data inputs is a clocked and an unclocked input buffer. Coupled to the TAP is an instruction register for receiving Standard defined and other test instructions provided by the external circuitry at the TAP. Also coupled to the TAP is a chain of boundary scan cells, each associated with a different one of the input pins and connected to the output of each input buffer coupled thereto, and a TAP controller for generating control signals to capture and shift data through the boundary scan cells in response to test instructions received by the instruction register. Compliance control circuitry, responsive to the instruction register and the TAP controller, operates to couple each BSR cell to the second input buffer when the instruction register has been loaded with a Standard defined instruction. When the instruction register has been loaded with an instruction corresponding to an input threshold voltage test of the data input pins, the compliance control circuitry couples the BSR cell to the first input buffer.

7 Claims, 5 Drawing Sheets

METHOD FOR COST-EFFECTIVE PRODUCTION TESTING OF INPUT VOLTAGE LEVELS OF THE FORWARDED CLOCK INTERFACE OF HIGH PERFORMANCE INTEGRATED CIRCUITS

FIELD OF THE INVENTION

The present invention relates generally to electronic components employing a standard test access port and boundary scan architecture conforming to the IEEE 1149.1 Standard and, more particularly, to a scheme for performing data input threshold voltage testing on a IEEE 1149.1 Standard-compliant electronic component having a forwarded clock interface.

BACKGROUND OF THE INVENTION

Ordinarily, a semiconductor device or integrated circuit ("IC") is designed such that data and control input signals are received simultaneously and subsequently processed by an internal logic circuit ("internal logic"). Before such an input signal is applied to the internal logic, it is amplified by a input buffer or receiver to have a sufficient driving power. To enable the IC to execute an expected signal processing, each input receiver is required to transfer a logic value of the input signal to the internal logic without error. Therefore, it is important that a threshold voltage of the input buffer be within predetermined limits specified by the IC manufacturer. To ensure that an input pin's drive capability conforms to the manufacturer's specified limits, input voltage measurement tests are routinely performed, for example, during outgoing DC parametric production test by the IC or system manufacturer.

The input voltage level test consists of two measurements on each of the input and bidirectional I/O pins, namely, VIH and VIL measurements. In a conventional test for the threshold voltage of the receiver in an IC, to confirm that a pin meets an input voltage level, a tester drives the pin with a voltage equal to the lowest specified voltage that is to be interpreted as logic value one in the case of a VIH test or a voltage equal to the highest specified voltage that is to be interpreted as logic value zero in the case of a VIL test. It then gathers and compares the response from the IC output pins. If the response matches the expected response, the receiver at the input or I/O pin under test is believed to have properly interpreted the input voltage. That pin is declared to have passed the particular input voltage test (i.e., VIL or VIH test) being performed.

While the VIH/VIL test is fairly simple in theory, it is difficult to implement because the logic value sensed by the tested pin's receiver is not observable and the pass/fail determination must be made indirectly based on the response of an IC's internal logic. The test is made even more difficult and tedious if isolation of the failing pin is desired or actual voltage limits are measured. In such cases, it is necessary to write several tests, each feeding only one input pin with the test voltage level while applying all other inputs with their full normal voltage levels. The test pattern applied by the test must sensitize the effect of voltage level sensed at the pin under test to an observable output.

To simplify the input threshold voltage test, prior test techniques have utilized the testability features of the Standard Test Access Port and Boundary-Scan Architecture or IEEE Std 1149.1 (hereinafter, the "Standard") now built into most ICs. In general, the Standard provides for the design of ICs in a standard fashion such that their internal or their external connections (or both) may be tested using a standard 4-wire bus interface known as the Test Access Port ("TAP"). While not defining every detail of Standard-compliant (or, alternatively, boundary-scan-compliant) circuits, the Standard does specify minimum requirements to be met by every boundary-scan-compliant component, whether it be a circuit board or an IC. Complete details of the Standard may be had with reference to the publication entitled "IEEE Standard Test Access Port and Boundary-Scan Architecture," published by the Institute of Electrical and Electronics Engineers, Inc. (1993).

The boundary scan architecture of the Standard involves a number of boundary scan cells (BSCs) inside each boundary-scan-compliant component corresponding to and connected to the buffer outputs of each of the component's input pins and output pins so that signals at the component's boundaries can be controlled and observed. The cells are interconnected to form a shift register chain around the border of the component. This interconnected path, referred to as a boundary scan register, and alternative paths consisting of either a test instruction register or other test data register, are provided with a serial input and output connection and appropriate clock and control signals via the Test Access Port. Using these data and test instruction "scan" paths, test instructions and associated test data can be fed or shifted into the component. The results of the execution of an instruction can be read out via the serial output connection.

The test instruction, once loaded into the instruction register and decoded by decode logic, selects the operational mode of the boundary scan cells and the data register to be used for a given test. A boundary-scan-compliant component must support a set of mandatory instructions, including SAMPLE/PRELOAD and EXTEXT.

SAMPLE/PRELOAD allows a boundary scan register to be initialized prior to selecting other instructions such as EXTEST. EXTEST allows testing of board-level interconnections and off-chip circuitry. Test data is shifted into the BSR and applied to the output pins in parallel. A test result appearing at the input pins is captured into the BSR in parallel and shifted out serially.

Also connected to the TAP is a TAP controller state machine and dispatch logic. The state machine interprets the Standard protocols received on the TAP control lines and the dispatch logic decodes the states and causes specific actions (e.g., capture, shift, update) to occur in the various registers.

As previously mentioned, the boundary scan architecture may be utilized to perform input threshold voltage testing. In response to certain clock and control signals provided at the TAP and test voltages applied to input pins by external test control circuitry, the test voltages sensed by the input pins are loaded into corresponding boundary scan cells and shifted out of the boundary scan register for examination. The capturing and shifting operations are achieved by following the Standard's protocols. Therefore, with this VIH/VIL testing approach, all input pins can be tested simultaneously yet individually to isolate failing pins.

For example, the VIH level test using a component's boundary scan register may be performed in the following manner. First, via the Standard defined SAMPLE/PRELOAD instruction, the boundary scan cells on all input pins are initialized to zeroes. Boundary scan cells controlling the direction of bidirectional I/O pins (i.e., "control cells") are also initialized such that the I/O pins they control are configured as input pins. Next, the Standard defined EXTEST instruction is loaded and the VIH test voltage is applied to all input pins and I/O pins. The TAP controller is caused to step through a data scan sequence to capture pin states and shift out the contents of the boundary scan register for observation. Once the VIH test is completed (i.e., the output is compared to an expected value and a pass/fail indication given for each input), the boundary scan register is prepared for the VIL test. This time, the boundary scan cells at all inputs are loaded with ones. The VIL test voltage is then applied to the input pins and I/O pins and the data scan sequence repeated.

In many high performance ICs, e.g., the ALPHA™ 21264 microprocessor available from Digital Equipment Corporation, it has been possible to achieve a higher bandwidth at the input interface or boundary by employing a forwarded clock interface. Clock forwarding techniques are discussed generally in U.S. Pat. No. 4,979,190, issued to Sager et al. Unfortunately, the use of a forwarded clock interface adversely impacts compliance of the boundary scan register with the Standard. For example, in a "high-end" forwarded clock interface, a data input pin may be coupled to two latch receivers each clocked by a forwarded clock. One latch receiver samples data on the rising edge of the forwarded clock while the other on the falling edge of the forwarded clock. A BSC located on such an input pin would violate the Rules 10.4.1e and 10.5.1i of the Standard, as its input capture path has a dependency on another input, namely the forwarded clock.

Of course, one may consider forcing one of the latch receivers to open during the boundary scan operation and using it to source the capture data; however, this solution works only if the latch receivers are level sensitive and not edge triggered. Besides, it has two serious shortcomings. First, it introduces undesired delay and skew in the sensitive clock path. Second, it does not cover the VIH/VIL testing of the second receiver, unless an elaborate provision is made to jam the clock enable to the other value.

Therefore, there exists a clearly felt need in the art to provide a scheme which allows for the input threshold voltage testing of each clocked receiver at a system data input of a forwarded clock interface using boundary scan testability features, but maintains compliance with the Standard for the execution of Standard-defined test operations.

SUMMARY OF THE INVENTION

Accordingly, it is an object of the present invention to provide a technique for performing VIH/VIL testing on a clocked receiver of a forwarded clock interface in a boundary-scan-compliant electronic component using such component's built-in boundary scan testability features without violating the Standard.

It is a further object of the present invention to provide a technique for performing VIH/VIL testing on each clocked receiver at a given system data input pin of a forwarded clock interface in a boundary-scan-compliant electronic component using such component's built-in boundary scan testability features without violating the Standard.

In a broad sense, the above and other objectives are attained by a boundary-scan-compliant component having a test access port (TAP) and a forwarded clock interface including data and forwarded clock inputs for receiving signals from and sending signals to external circuitry during a test operation. The component has connected to each of its data inputs a clocked and an unclocked input buffer. Coupled to the TAP is an instruction register for receiving IEEE 1149.1 Standard defined and other test instructions provided by the external circuitry at the TAP.

The component further includes a boundary scan register and a TAP controller, both of which are connected to the TAP. The boundary scan register comprises a chain of boundary scan cells, each associated with a different one of the input pins and connected to the output of each input buffer coupled thereto. The TAP controller generates control signals to load data from outputs of the input buffers into the boundary scan cells and to shift the captured data through the boundary scan cells in response to test instructions received by the instruction register.

Additionally, there is included in the component compliance control circuitry, responsive to the instruction register and the TAP controller, for selectively coupling outputs of the clocked and unclocked input buffers connected to each data input pin for capture by the BSR cell with which such data input pin is associated. The compliance control circuitry operates to couple each BSR cell to the unclocked input buffer when the instruction register has been loaded with an IEEE 1149.1 Standard defined instruction and, alternately, operates to couple the BSR cell to the clocked input buffer when the instruction register has been loaded with one of the other instructions corresponding to an input threshold voltage test of the data input pins.

The forwarded clock interface scheme of the present invention offers several advantages. It extends the benefit of boundary scan register based VIH/VIL testing to a forwarded clock interface without adding any delays in the clock path. It also maintains compliance with the Standard for those test operations defined by the Standard.

BRIEF DESCRIPTION OF THE DRAWINGS

The above objects, features and advantages of the present invention will become more apparent from the following detailed description taken in conjunction with the accompanying drawings, in which.

DESCRIPTION OF THE PREFERRED EMBODIMENT

Figure 1:
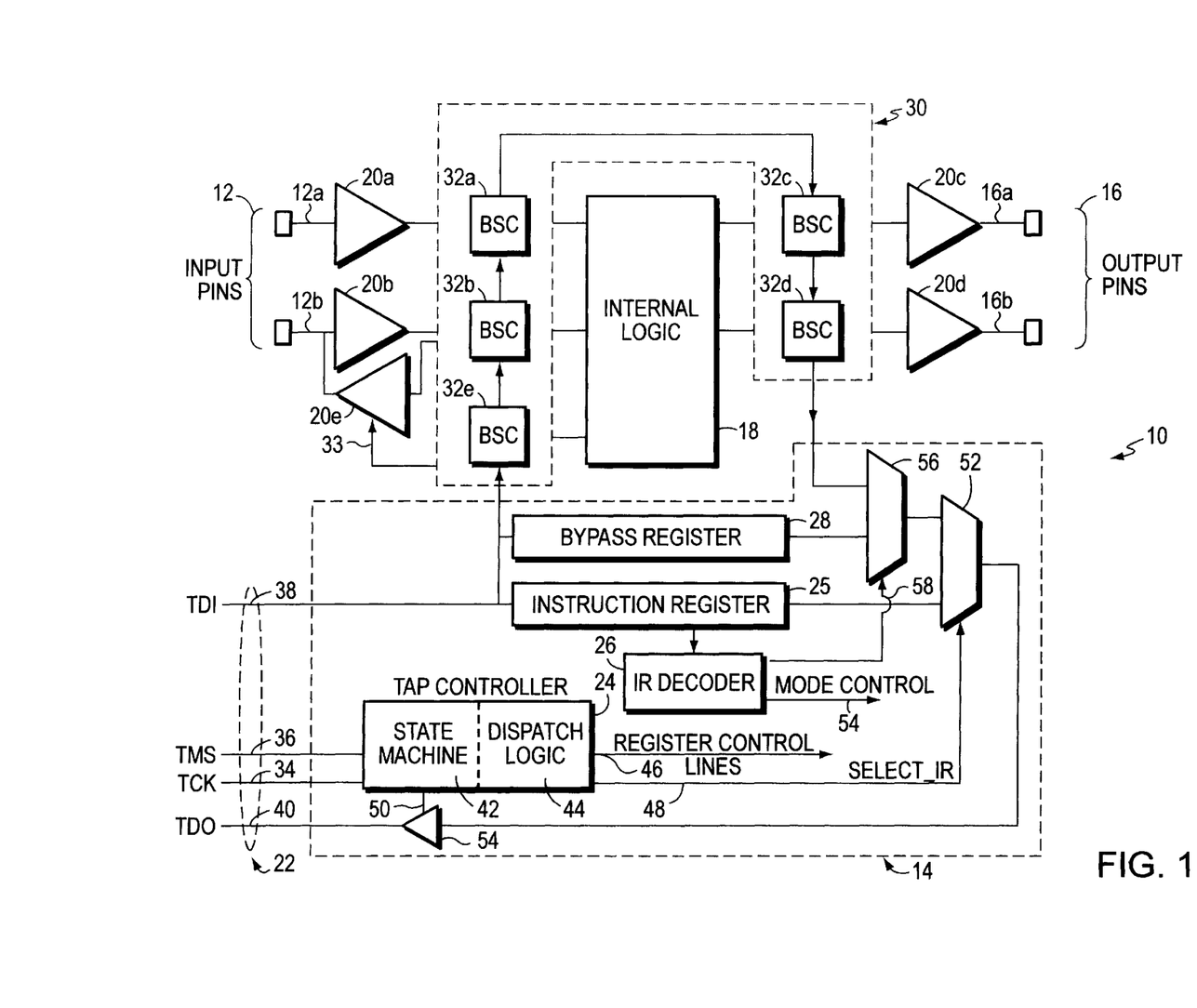
FIG. 1 is a block diagram of a typical integrated circuit incorporating boundary-scan-compliant test circuitry and having inputs capable of being tested for conformance to input threshold voltage limits via IEEE 1149.1 Standard defined test operations.

A typical boundary scan test application is illustrated in FIG. 1. With reference to FIG. 1, there is shown a boundary-scan-compliant electronic component 10, i.e., a product having built-in testability features conforming to the Standard, hereafter, simply "component". In a test environment, the component under test receives input from external circuitry, usually a master controller (not shown). Typically, the master controller is an automatic test equipment ("ATE") in a manufacturing environment or a dedicated controller implemented as part of a system link to an IEEE 1149.1 Standard bus in an installed system. Test software to run the master controller either resides in the master controller itself (for example, if it is an ATE) or is provided from an on-line non-volatile memory (for example, ROM-based diagnostics) supporting the controller. The test software, together with the master controller, feed the product under test with the necessary protocol and data to execute test operations in its testability features. The component or product under test 10 may be an IC, a circuit board or a sub-system. For the purposes of this example, the component is to be considered as an IC.

During test operations, signals may be received by the component 10 at a system input pin 12a and and bidirectional pin 12b (configured as an input), collectively referred to as input pins 12, as well as at test interface 14, and exit the component 10 at system output pins 16a–b and bidirectional pin 12b (configured as an output), collectively referred to as output pins 16, and via the test interface 14. Each input and output pin is connected to an internal logic circuit ("internal logic") 18, which performs the IC's predetermined functions, by a buffer. More specifically, input pins 12a and 12b are connected to input buffers (or receivers) 20a and 20b, respectively, and output pins 16a and 16b and 12b are connected to output buffers (or output drivers) 20c, 20d and 20e, respectively.

The test interface 14 includes a Test Access Port (TAP) 22, a TAP controller 24, an instruction register 25, an IR decoder 26 and a bypass register 28, all of which are mandatory elements of the Boundary Scan Architecture as defined by the Standard. Also mandated by the Standard is a Boundary Scan Register (BSR) 30, which is provided along the input and output boundary of the internal logic. The BSR is a serially accessed data register comprised of a series of boundary scan cells (BSCs) 32a–32e, each of which is associated with (or corresponds to) a different system pin. In the example shown in FIG. 1, BSCs 32a through 32d are coupled to the outputs of buffers 20a through 20d, respectively. Additionally, as provided for in the Standard, there is an I/O control BSC (or control cell) 32e connected to a bidirectional control line 33 which controls the output driver 20e for the bidirectional pin 12b.

The TAP 22 supports serial transfer of test data and instructions. It consists of four pins: a Test Clock ("TCK") 34, a Test Mode Select ("TMS") 36, a Test Data Input ("TDI") 38 and a Test Data Output ("TDO") 40. TDI 38 is a serial input through which test instructions and test data enter the device. TDO 40 is the serial output through which test instructions and data from the BSR leave the device. Thus, the instruction register 25 and data register 30 are separate paths between TDI 38 and the TDO 40.

The TAP controller 24 includes a synchronous finite state machine 42 which selects the mode of operation of the test circuitry by interpreting the protocols received on the TMS line and a dispatch logic circuit ("dispatch logic") 44 which decodes the state machine states and dispatches a set of register control and clocking signals 46 to be applied to the different registers shown in FIG. 1. Additionally, the TAP controller provides as outputs, a select_IR signal 48 and enable signal 50 which are applied as inputs to an output multiplexer (MUX) 52 and an output driver circuit 54. The dispatch logic generates the select_IR signal 48 when the instruction register is to be the path between TDI and TDO. The output of the output MUX 52 goes to the input of the output driver circuit 54. The controller generates the enable signal 50 during machine states defining instruction register and data register shifting operations. The controller receives as inputs the Test Clock (TCK) and Test Mode Select (TMS) inputs. TMS 36 is the carrier of the Standard's serial communication protocol. Together, TMS and TCK determine the currently active state of the controller state machine as well as determine whether an instruction register scan or data register scan is performed.

The instruction register 25 receives and holds test instructions. The operations of the instruction register are controlled by the signals dispatched from the TAP controller. The instructions are decoded by the IR decoder 26, which then generates a MUX control signal 58 as input to a multiplexer (MUX) 56 and mode control lines 59 as input to the BSCs. The control signal 58 selects the data register (i.e., BSR or by-pass) to be used for the test operation defined by the instruction and the mode control lines 59 control the operating mode of the boundary scan register (i.e., the output multiplexers in the BSCs on the input and output pins).

Figure 2:
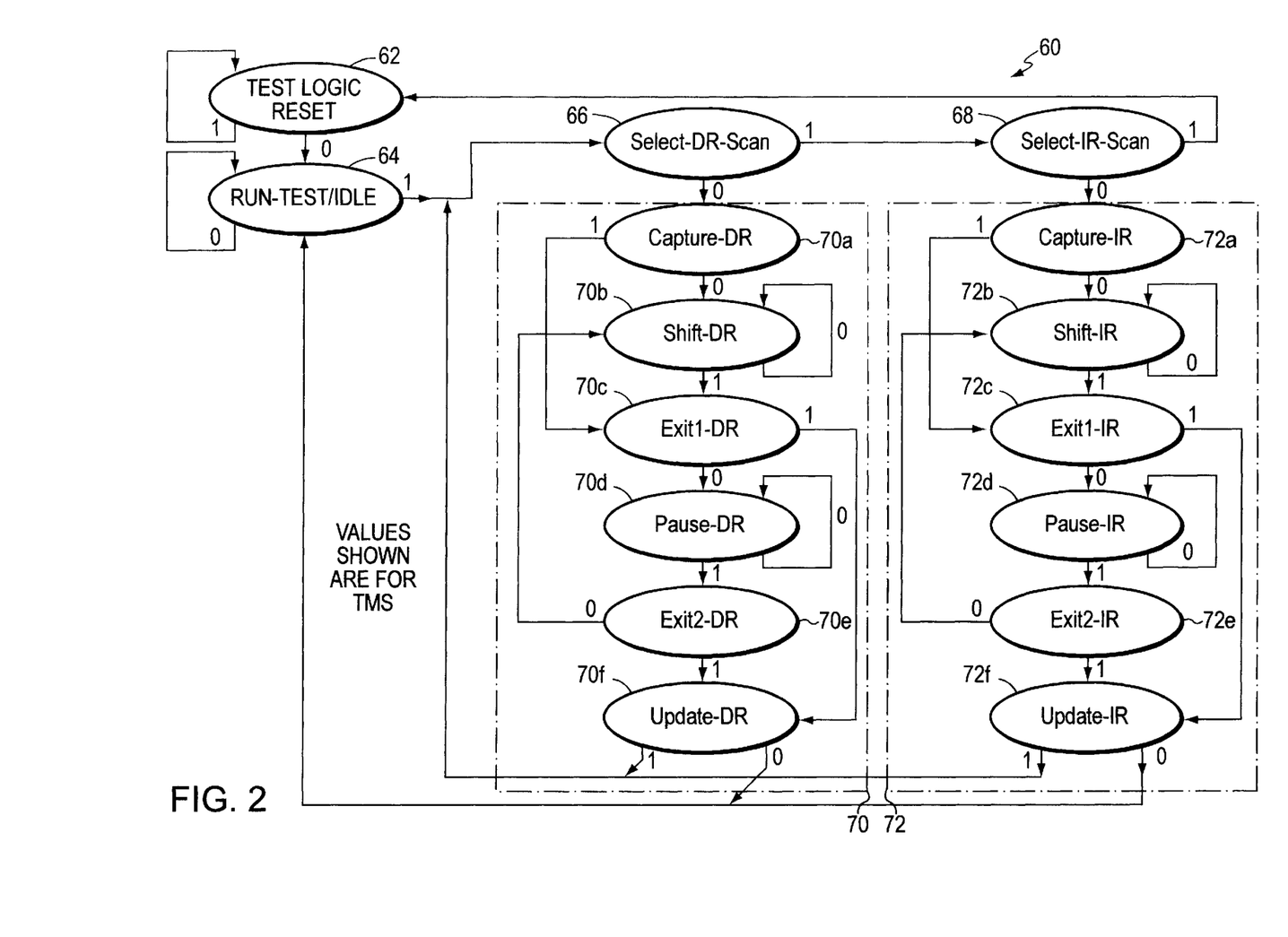
FIG. 2 is a state diagram of the TAP controller state machine of FIG. 1.

FIG. 2 illustrates the state diagram of the main state sequence 60 of the TAP controller state machine 42 shown in FIG. 1 as defined by the Standard. The operation of the circuitry of FIG. 1 in performing a boundary scan test operation will now be described with the aid of the state diagram shown in FIG. 2. As previously indicated, the state transitions occur based in the value of TMS at the time of a rising edge of TCK.

During normal functional operation of the IC, the TAP controller state machine is in a test logic-reset state 62. When test access is required, a protocol is applied via the TMS and TCK inputs causing the TAP controller to exit the Test-Logic-Reset state and park in the run-test/idle state 64. From the run-test/idle state, the state machine can select a data scan 66 or an instruction scan 68 to transition the TAP controller through the appropriate states of the corresponding scan sequence, i.e., a data scan sequence 70 or a instruction sequence 72. The data scan sequence includes the following states: capture-DR 70a, shift-DR 70b, exit1-DR 70c, pause-DR 70d, exit2-DR 70e and update-DR 70f. The instruction scan sequence mirrors that of the data scan sequence and the IR states corresponding to 70a–f are indicated by 72a–f. Since the operation of the state machine as defined by the Standard is known and especially well understood by those familiar with the above-mentioned publication, the details are largely omitted herein.

Each instruction covered by the Standard defines a test operation. The instruction selects a data register to shift data between TDI_H and TDO_H during the Shift-DR controller state. The Standard specifies expected behavior for a minimal set of mandatory instructions, including SAMPLE/PRELOAD and EXTEST. As previously noted in the Background section, the SAMPLE/PRELOAD instruction allows a BSR to be initialized prior to selecting other instructions such as EXTEST. It also makes it possible to capture data at IC pins while the IC is functioning normally and shift that data out for examination. Test logic behavior is as follows. The test logic selects only the BSR to be connected between TDI and TDO in the Shift-DR state. The states of all signals flowing through system pins are loaded into the BSR in the Capture-DR state. Parallel output latches included in BSR cells load data from the associated shift-register stage in the Update-DR state. The function of the EXTEST instruction is as previously described in the Background section. The test logic selects only the BSR to connect between the TDI and TDO during the Shift-DR state.

Figure 3:
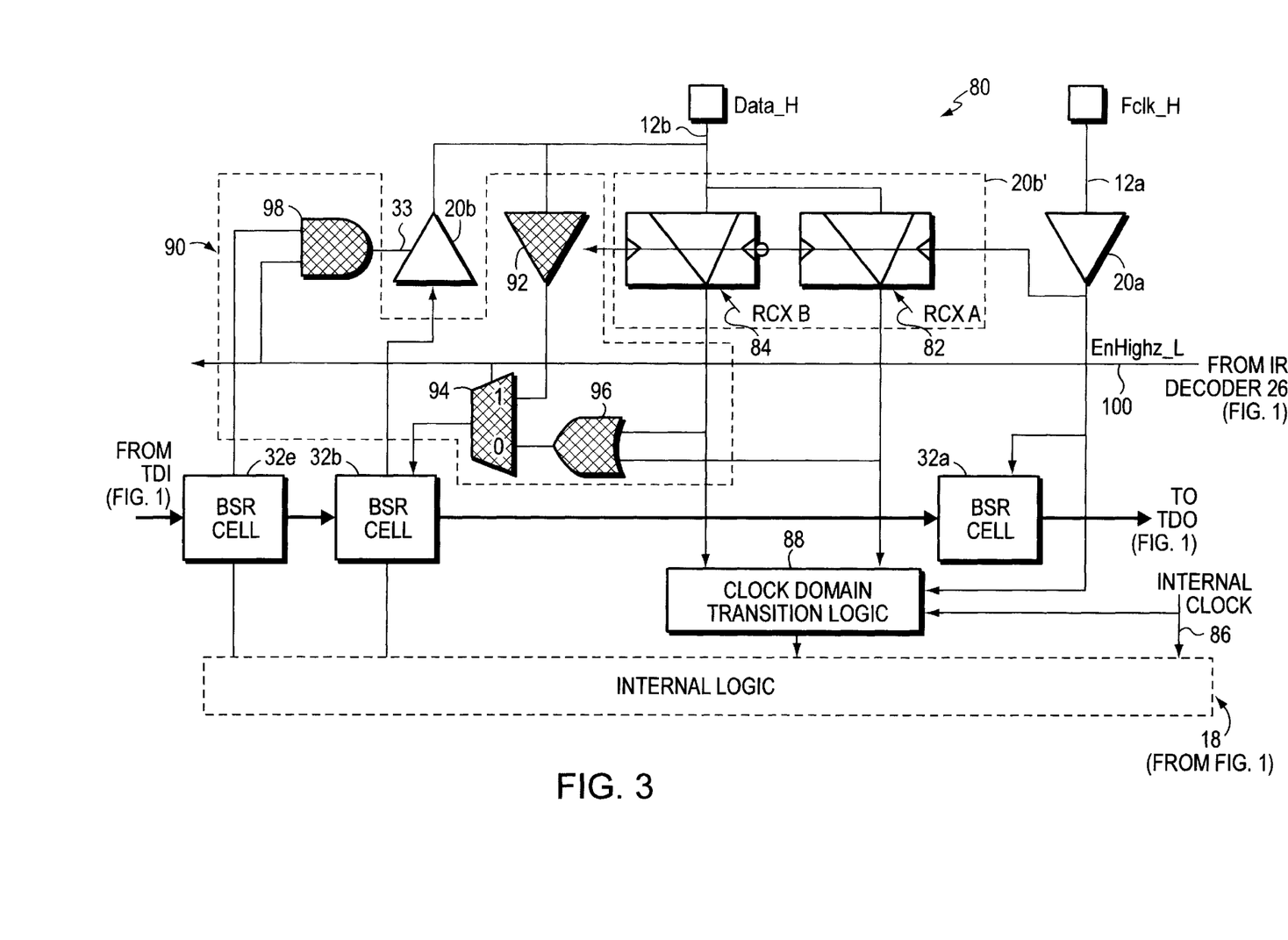
FIG. 3 is a schematic diagram of a forwarded clock input interface utilizing a compliance control scheme in accordance with the principles of the present invention.

In FIG. 3, there is shown an exemplary forwarded clock input interface 80 which incorporates the circuitry of and operates in accordance with the present invention. It will be understood that the forwarded clock interface resides on a boundary-scan-compliant component such as that described with reference to FIG. 1. That is, the forwarded clock interface 80 is coupled to the internal logic 18 (from FIG. 1, shown in FIG. 3 in dashed lines) and test interface 14 (from FIG. 1). To the extent that there are elements common to both FIG. 1 and FIG. 3, like elements will be identified by like reference characters.

The forwarded clock interface 80 includes a bidirectional pin 12b ("Data_H") connected to a first or clocked input buffer which, to differentiate it from the unclocked input buffer 20b from FIG. 1, will be designated 20b'. Clocked input buffer 20b' includes a first or rising edge latch receiver (RCX_A) 82 and a second or falling edge latch receiver (RCX_B) 84, which are clocked by a forwarded clock signal received at a clock input pin ("Fclk_H"), designated 12a' to distinguish it from the data input pin 12a of FIG. 1. The latch receiver 82 samples data on the rising edge of the forwarded clock while the latch receiver 84 samples data on the falling edge of the forwarded clock.

The forwarded clock is connected to an input buffer or receiver 20a. Latch receivers 82 and 84, along with receiver 20a and clocks Fclk_H and an internal clock 86, are coupled to a clock domain transition logic circuit 88. The clock domain transition logic circuit and the internal clock 86 are also connected to the internal logic 18 which, as already noted, represents the chip's functional core logic.

Also included in the forwarded clock interface 80 are boundary scan cells (BSCs) 32e, 32b and 32a associated with the bidirectional control line 33, the bidirectional data input pin 12b and the forwarded clock input pin 12a', respectively. The structure of the boundary scan cells conforms to the requirements of the Standard. Therefore, these cells support Standard mandated instructions such as SAMPLE/PRELOAD and EXTEST.

What has been described thus far is a simplified "high-end" forwarded clock interface (such as that discussed briefly in the Background section) with boundary scan cells at the system input pins and control lines. In accordance with the present invention, the forwarded clock interface is further provided with "Standard compliance" (compliance) control circuitry 90, the various elements of which are shown shaded in FIG. 3 to differentiate them from the other elements in the figure. The compliance control circuitry includes a "dedicated" receiver 92, a buffer select multiplexer (MUX) 94, first and second gates 96 and 98, respectively, and a global control line EnHighz_L 100. Dedicated receiver 92, which couples the input side of bidirectional pin 12b to the buffer select MUX 94, supports Standard-compliant operation. Buffer select MUX 94, controlled by the control signal EnHighz_L 100, selects the BSR capture data either from the dedicated receiver 92 or from the first gate 96, which is the OR output of clocked receivers 82 and 84. The former is used during Standard-compliant operation, while the latter is used during VIH/VIL testing of the system data input pin (i.e., bidirectional pin 12b' configured as an input pin).

The present invention also provides for the addition of a new instruction VIXTEST to the existing Standard-mandated instruction set to support the VIH/VIL test of the clocked data input receivers. The VIXTEST instruction causes the TAP controller dispatch logic to dispatch the boundary scan register control signals (similar to the EXTEST instruction) along with an assertion of the EnHighz_L control signal 100. The assertion of EnHighz_L selects the latch receiver outputs for the capture data. Recall that for normal Standard-compliant operations such as EXTEST, the EnHighz_L is not asserted. Thus, the capture data is sourced from the unclocked receiver 90 and the operation remains compliant with the Standard.

It should be noted that the global control signal EnHighz_L sent from the IR decoder 26 (from FIG. 1) already exists for components that support the optional HIGHZ instruction defined by the Standard. When the HIGHZ instruction is active, EnHighz_L is asserted and all outputs and I/O drivers are tristated. This is accomplished by connecting the EnHighz_L signal to the second gate 98 as shown in FIG. 3. The second gate 98 may be eliminated from implementations that do not support HIGHZ instruction.

Although the preferred embodiment has described with respect to only one system data pin, i.e., bidirectional pin 12b, it will be recognized that the forwarded clock interface may have many data input and/or bidirectional pins and each of these pins would be provided with the compliance control circuitry 90. Of course, data input pins in all designs as well as bidirectional pins in designs not supporting the HIGHZ instruction would not require the second gate 98.

Also, those skilled in the art can be appreciate that the present invention is equally applicable to a forwarded clock interface which samples data on only one edge of a forwarded clock. In such a design, input buffer 20b' of forwarded clock 80 includes one or the other of the latch receivers 82 and 84 and the first gate 96 is no longer necessary.

Figure 4:
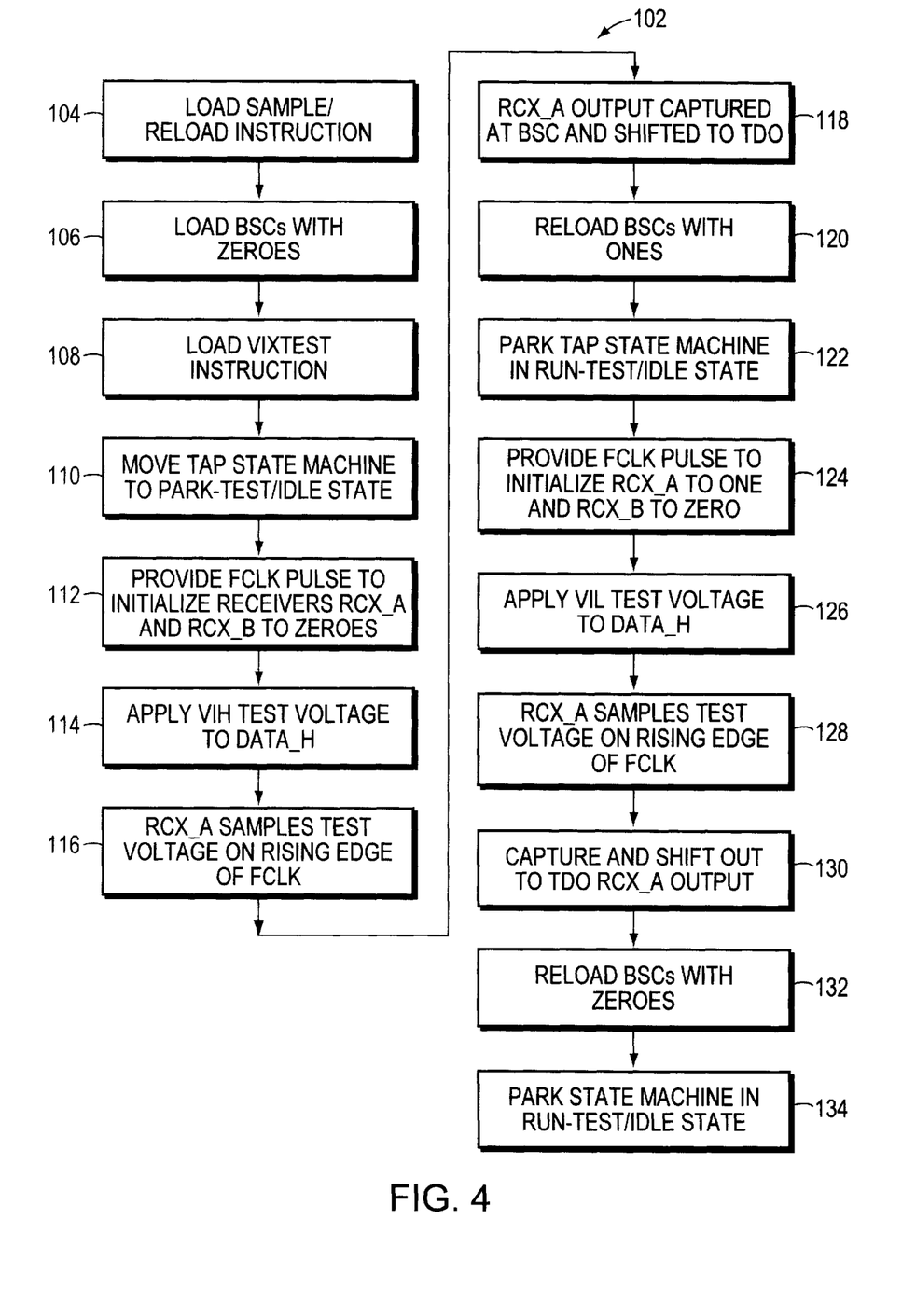
FIG. 4 is a flow diagram of VIH/VIL testing on the rising edge latch receiver coupled to the data input pin of the forwarded clock interface shown in FIG. 3.

FIG. 4 depicts the test process flow for VIH/VIL testing on a rising edge latch receiver 102 such as RCX_A of the forwarded clock interface depicted in FIG. 3. In regards to this test process, it is assumed that the latch receivers (RCX_A and RCX_B) are edge-sensitive.

Figure 5:
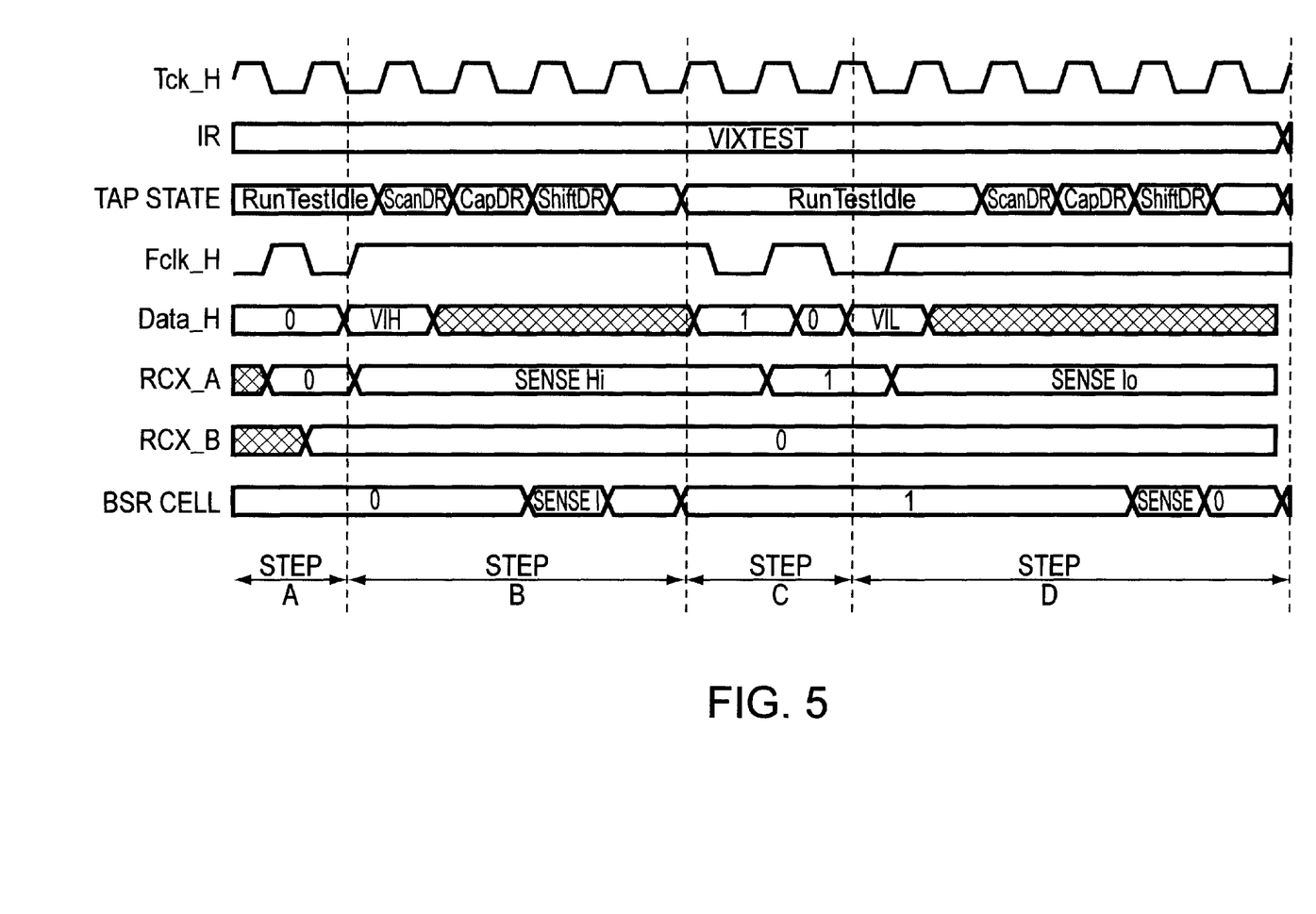
FIG. 5 is a timing diagram of VIH/VIL testing on the rising edge latch receiver.

Referring to FIG. 4, VIH/VIL testing 102 commences with the set up of the boundary scan cells (e.g., 32a, 32b and 32e of FIG. 3) via the SAMPLE/PRELOAD instruction at step 104. That is, the SAMPLE/PRELOAD instruction is loaded into the IR register as a result of the appropriate TAP signals being applied to the TAP controller by an external source or test circuitry (e.g., ATE tester). In response to the SAMPLE/PRELOAD instruction, zeroes are shifted into the boundary scan cells corresponding to forwarded clock input and I/O pins, e.g., BSCs 32a and 32b of FIG. 3, via TDI and appropriate values are provided to I/O control BSCs to configure any I/O pin, e.g., I/O pin 12b of FIG. 3, as an input (also via TDI) at step 106. That is, with reference to FIG. 3, the control cell 32 is initialized to configure I/O pin 12b as an input pin. Steps 104 and 106 complete the BSR set up for VIH test. Once the BSR set up has been completed, the external test circuitry or source loads the VIXTEST instruction, supplies the appropriate Data_H and Fclk_H signals and maneuvers the TAP controller state machine to capture and off-load responses, as discussed in greater detail with reference to steps 108 through 118 of FIG. 4 below and illustrated in the timing diagram of FIG. 5.

Still referring to FIG. 4, the VIXTEST instruction is loaded into the instruction register (step 108). The effect of the selection of VIXTEST is to cause the selection of the BSR as the path between TDI and TDO and the generation of the appropriate control signals to the BSCs. As discussed above with respect to FIG. 3, VIXTEST also causes the assertion of the global EnHighz_L control line, thereby selecting to source capture data from the output of the clocked input buffer (as opposed to the unclocked or dedicated receiver). In step 110, the TAP controller state machine is parked in Run-Test/Idle state to commence execution of a data scan sequence. Next, the RCX_A and RCX_B latch receivers are initialized to zeroes by wiggling Fclk_H (step 112) and a VIH test voltage is applied to the Data_H pin (step 114). With the rising edge of Fclk_H, the rising edge latch receiver RCX_A samples the test voltage and the RCX_A output is sensitized to the connected boundary scan cell's capture port (step 116). At this point, the TAP controller state machine moves through the Capture-DR and Shift-DR states, causing the BSC corresponding to the data input pin to capture and and shift out towards TDO the response at the output of RCX_A (step 118). At step 120, the BSCs associated with the inputs are reloaded with a logic one in preparation for the VIL test, and any control cells are provided with appropriate values for configuring I/O pins as inputs. Lastly, the state machine is parked in the Run-Test/Idle state (step 122).

To proceed with the VIL test, an Fclk_H pulse is provided to initialize the RCX_A latch receiver to logic one and the RCX_B latch receiver to logic zero (step 124). Once the latch receivers have been so initialized, the VIL test voltage is applied to the Data_H pin (step 126). With the rising edge of Fclk_H, the rising edge latch receiver RCX_A samples the test voltage and the RCX_A latch receiver output is sensitized to its corresponding boundary scan cell's capture port (step 128). The test process again moves the state machine through Capture-DR and Shift-DR states to capture and shift out the response (step 130). To ready the interface for VIH test on the falling edge latch receiver, the BSCs associated with the inputs are reloaded with a logic zero and the control BSC is loaded with an appropriate value to configure the I/O pin that it controls as an input (step 132). Finally, the test process returns the state machine to the Run-Test/Idle state 134.

VIH/VIL testing on the falling edge receiver is performed similarly by repeating the steps 112 through 134 with some modification. At step 124, RCX_A is initialized to logic zero and RCX_B is initialized to logic one. At steps 116 and 128, RCX_B samples the applied test voltage on the falling edge of Fclk_H. Lastly, it is the sensed voltage from RCX_B that is captured by the BSC at steps 118 and 130. For a better understanding of the timing relationships of the various signals and logic while performing the VIH/VIL testing on the rising edge latch receiver, there is provided in FIG. 5 a timing diagram of steps 112 through 134 of FIG. 4. More particularly, Steps A, B, C and D correspond to steps 112–116, 118–122, 124–126 and 128–134, respectively.

Although the above description has proceeded with reference to a specific embodiment of the invention, the invention is not necessarily limited to the particular embodiment shown herein. It is to be understood that various other adaptations and modifications may be made within the spirit and scope of the invention as set forth by the claims.

What is claimed is:

1. A boundary-scan-compliant component, the boundary-scan-compliant component having a test access port (TAP) and a forwarded clock interface including data and forwarded clock input pins for receiving signals from and sending signals to external test circuitry during a test operation, the boundary-scan-compliant component comprising:

a first and second input buffer coupled to each of the data input pins, the first input buffer being responsive to the forwarded clock; input an instruction register coupled to the TAP, the instruction register for receiving IEEE 1149.1 defined and other test instructions provided by the external test circuitry at the TAP;

a boundary scan register coupled to the TAP, the boundary scan register including boundary scan cells associated with each of the input pins and connected to the output of each input buffer coupled thereto;

a TAP controller for generating control signals to capture data from outputs of the input buffers into the boundary scan cells to which the input buffers are connected and to shift the captured data through the boundary scan cells in response to test instructions received by the instruction register; and compliance control circuitry, responsive to the instruction register and the TAP controller, for selectively coupling outputs of the first and second input buffers connected to each data input pin for capture by the BSR cell with which the input pin is associated, the compliance control circuitry coupling each BSR cell to the second input buffer when the instruction register has been loaded with one of the IEEE 1149.1 defined test instructions and coupling the BSR cell to the first input buffer when the instruction register has been loaded with one of the other test instructions corresponding to an input threshold voltage test of the data input pins.

2. A boundary-scan-compliant component according to claim 1, wherein the second input buffer is a rising edge receiver.

3. A boundary-scan-compliant component according to claim 1, wherein the second input buffer is a falling edge receiver.

4. A boundary-scan-compliant component, the boundary-scan-compliant component having a test access port (TAP) and a forwarded clock interface including data and forwarded clock inputs for receiving signals from and sending signals to external test circuitry during a test operation, the component comprising:

a first and second input buffer coupled to each of the data input pins, the first input buffer being responsive to the forwarded clock and including two latch receivers, one of the two latch receivers sampling data on the rising edge of the forwarded clock and the other sampling data on the falling edge of the forwarded clock;

an instruction register coupled to the TAP, the instruction register for receiving IEEE 1149.1 defined instructions and other test instructions provided by the external test circuitry at the TAP;

a boundary scan register coupled to the TAP, the boundary scan register including boundary scan cells associated with each of the input pins and connected to the output of each input buffer coupled thereto;

a TAP controller for generating control signals to load data from outputs of the input buffers into the boundary scan cells and to shift the captured data through the boundary scan cells in response to test instructions received by the instruction register; and compliance control circuitry, responsive to the instruction register and the TAP controller, for selectively coupling outputs of the first and second input buffers connected to each data input pin for capture by the BSR cell with which the data input pin is associated, the compliance control circuitry coupling each BSR cell to the second input buffer when the instruction register has been loaded with one of the IEEE 1149.1 defined test instructions and coupling the BSR cell to one of the two latch receivers when the instruction register has been loaded with one of the other test instructions corresponding to an input threshold voltage test of the data input pins.

5. A method of performing input threshold voltage testing on a selected data input of a boundary-scan-compliant component having a test interface and data and forwarded clock inputs for receiving signals from and sending signals to external test circuitry during a test operation, the test interface having a test access bus for coupling the test interface to a boundary scan register located in the component, the boundary scan register having boundary scan cells corresponding each of the data and forwarded clock inputs, the method comprising the steps of:

associating an input buffer with the selected data input and the boundary scan cell corresponding thereto, the input buffer including an unclocked receiver and a clocked receiver responsive to the forwarded clock input, the unclocked receiver for supporting IEEE 1149.1 defined test operations;

providing a SAMPLE/PRELOAD test instruction to the test interface via the test access bus;

initializing each of the boundary scan cells to zeroes;

providing a VIXTEST test instruction to the test interface via the test access bus, the VIXTEST test instruction being defined to cause the selection of the output of the clocked receiver for sourcing of data by the boundary scan cell with which the clocked receiver is associated and the selection of the boundary scan register as a data path during a data scan sequence;

providing control signals to the test interface to commence execution of a data scan sequence;

providing a pulse on the forwarded clock input to initialize the clocked receiver to a zero;

applying a high level test voltage value to the selected data input;

sampling at the clocked receiver in response to a pulse on the forwarded clock the high level test voltage value applied to the selected data input;

performing a data scan sequence to capture at the boundary scan cell associated with the selected data input the sampled high level test voltage value and shift the sampled high level test voltage value captured at the boundary scan cell out of the boundary scan register;

reloading the boundary scan cells with ones;

repeating the step of providing control signals to the test interface to commence the execution of a data scan sequence;

providing a pulse to the forwarded clock input to initialize the clocked receiver to a one;

applying a low level test voltage value to the selected data input;

sampling at the clocked receiver in response to a pulse on the forwarded clock input the low level test voltage value applied to the selected data input;

repeating the step of performing a data scan sequence; and causing the test interface to terminate the test operation specified by the test instruction VIXTEST.

6. A method of performing input threshold voltage testing on a selected data input of a boundary-scan-compliant component having a test interface and data and forwarded clock inputs for receiving signals from and sending signals to external test circuitry during a test operation, the test interface having a test access bus for coupling the test interface to a boundary scan register located in the component, the boundary scan register having boundary scan cells corresponding to each of the data and forwarded clock inputs, the method comprising the steps of:

associating an input buffer with the selected data input and the boundary scan cell corresponding thereto, the input buffer including an unclocked receiver and a clocked receiver including a rising edge latch receiver and a falling edge latch receiver responsive to the forwarded clock input, the unclocked receiver for supporting IEEE 1149.1 defined test operations;

providing a SAMPLE/PRELOAD test instruction to the test interface via the test access bus;

initializing each of the boundary scan cells with zeroes;

providing a VIXTEST test instruction to the test interface via the test access bus, the VIXTEST test instruction being defined to cause the selection of the output of the clocked receiver for sourcing of data by the boundary scan cell with which the clocked receiver is associated and the selection of the boundary scan register as a data path during a data scan sequence;

providing control signals to the test interface to commence execution of a data scan sequence;

providing a pulse on the forwarded clock input to initialize the rising edge and falling edge latch receivers to zeroes;

applying a high level test voltage value to the selected data input;

sampling at the rising edge latch receiver on the rising edge of the forwarded clock input the high level test voltage value applied to the selected data input;

performing a data scan sequence to capture at the boundary scan cell associated with the selected data input the sampled high level test voltage value and shift the sampled high level test voltage value captured by the boundary scan cell out of the boundary scan register;

reloading the boundary scan cells with ones;

repeating the step of providing control signals to the test interface to commence the execution of a data scan sequence;

providing a pulse on the forwarded clock input to initialize the rising edge latch receiver to a one and the falling edge latch receiver to a zero;

applying a low level test voltage value to the selected data input;

sampling at the rising edge latch receiver the applied low level test voltage value on the rising edge of the forwarded clock; and repeating the step of performing a data scan sequence.

7. A method of performing input threshold voltage testing according to claim 6, further comprising the steps of:

providing a pulse on the forwarded clock input to initialize the latch receivers to zeroes;

applying a high level test voltage value to the selected data input;

sampling at the falling edge latch receiver on the falling edge of the forwarded clock the high level test voltage value applied to the selected data input;

performing a data scan sequence to capture at the boundary scan cell associated with the selected data input the sampled low level test voltage value and shift out of the boundary scan register the sampled low level test voltage value captured at the boundary scan cell;

reloading the boundary scan cells with ones;

repeating the step of providing control signals to the test interface to commence the execution of a data scan sequence;

providing a pulse on the forwarded clock input to initialize the falling edge latch receiver to a one and the rising edge latch receiver to a zero;

applying a low level test voltage value to the selected data input;

sampling at the falling edge latch receiver the applied low level test voltage value on the falling edge of the forwarded clock;

repeating the step of performing a data scan sequence; and causing the test interface to terminate the test operation specified by the test instruction VIXTEST.

* * * * *